(12) United States Patent
Stetson (10) Patent No.: US 8,120,355 B1
(45) Date of Patent: Feb. 21, 2012

(54) MAGNETIC ANOMALY DETECTOR

(75) Inventor: John B. Stetson, New Hope, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 230 days.

(21) Appl. No.: 12/472,467

(22) Filed: May 27, 2009

(51) Int. Cl.
*G01R 33/02* (2006.01)
(52) U.S. Cl. .................................. 324/244.1; 324/76.21
(58) Field of Classification Search ............... 324/76.21, 324/76.24, 244.1
See application file for complete search history.

(56) References Cited

U.S. PATENT DOCUMENTS

| | | |
|---|---|---|
| 5,189,368 A | 2/1993 | Chase |
| 7,477,053 B2 * | 1/2009 | Pinsky et al. .................. 324/261 |

OTHER PUBLICATIONS

J.M. Talyor, et al., "High-sensitivity diamond magnetometer with nanoscale resolution", Nature Physics, vol. 4, Oct. 2008, pp. 810-816.
Beyer, William H. Ph.D.,"CRC Standard Mathematical Tables", CRC Press, Inc., Cover page, publications page, copyright page, p. 330, Copyright 1981.
Kailath, Thomas, "Linear Systems", Prentice Hall, Inc., Cover page, publications page, copyright page, pp. 656-657, pp. 662-663, p. 664, Copyright 1980.

* cited by examiner

*Primary Examiner* — Bot L LeDynh
(74) *Attorney, Agent, or Firm* — Howard IP Law Group, P.C.

(57) ABSTRACT

A magnetic anomaly detector includes a magnetically active device which produces analog signals in response to magnetic fields. The analog signals are time quantized and then discrete-time differentiated. The differentiated signals are applied to a low-pass filter. The filtered signals are Fourier transformed into an amplitude-frequency spectrum. An error detector compares at least one reference amplitude-frequency spectrum with the reference spectrum to identify the presence or absence of a magnetic anomaly. The resulting error is displayed on a monitor or operates an alarm.

20 Claims, 6 Drawing Sheets

MAGNETIC ANOMALY DETECTOR

BACKGROUND OF THE INVENTION

Magnetometers are generally used for determining the existence of, and the magnitude of, static or fluctuating or alternating magnetic fields. Some useful applications include spacecraft attitude determination, navigation using Earth's magnetic field, and remote detection of magnetic objects, such as submerged submarines.

An ordinary magnetic compass with a "floating" magnetic needle is a form of magnetometer, which has likely been used for at least a thousand years to indicate the local direction of the Earth's magnetic field. The magnetized needle has a low-energy state when it is aligned with the local magnetic field.

Other types of magnetometers include various inductor-based arrangements including flux-gate magnetometers, in which a varying excitation voltage is applied to a first coil to produce a magnetic field of varying amplitude and a separate differential secondary coil senses the magnetic field produced by the first coil to thereby generate an output voltage which depends upon the excitation voltage and any intervening magnetic field.

A prior-art electron-spin-detection magnetometer is described in U.S. Pat. No. 5,189,368, issued Feb. 23, 1993 in the name of W. E. Chase. In the Chase magnetometer, describes an electron spin magnetometer in which a first pulsed light source of suitable wavelength excites electron spin precession about the incident magnetic field vector and also results in a phase change between electron quantum energy spin (+½ and −½) depending upon the magnitude of the magnetic field. Upon excitation with a second pulse of light, the electron orbits are driven to their ground state, which results either in the release of photons or in grouping of atoms in populations having the +½ and −½ spin states, which thereafter decay with time depending upon the nature of the material. The Chase magnetometer uses a third signal or first interrogating signal, which may be a continuous radio-frequency (RF) carrier, which is modulated by the decaying electron spins after the second excitation light pulse, from which modulation the magnitude of the magnetic field may be determined.

An article by J. M. Taylor et al, which appeared at pp 810-816 in the magazine Nature physics, Vol. 4, Oct. 2008, entitled *High-sensitivity diamond magnetometer with nanoscale resolution* describes some prior art and physics of magnetometry. The Taylor et al. article also describes detection of weak magnetic fields taking advantage of coherent control of solid-state electron spin quantum bits. The Taylor et al. magnetometer makes use of solid crystal detection material, which is advantageous in that the effective sensitivity is greater than that of gas-based systems because of the greater density of the sites available for electron excitation.

Figure 1A:
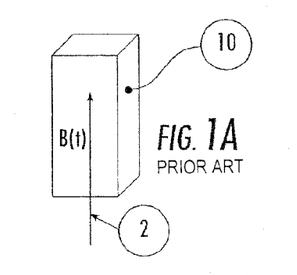
FIG. 1A is a simplified representation of a prior-art solid crystal magnetic sensor.
Figure 1B:
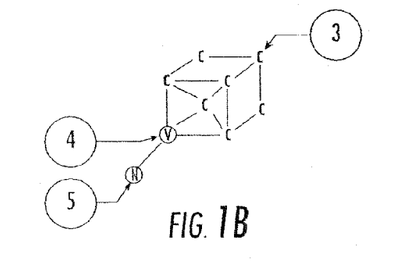
FIG. 1B is a representation of diamond crystal lattice with nitrogen-caused vacancy sites which can be used in the sensor of FIG. 1A.
Figure 1C:
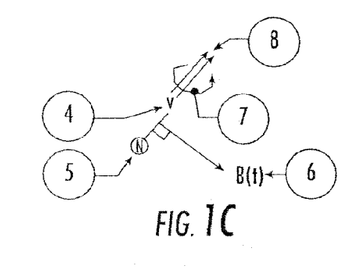
FIG. 1C illustrates a precession direction in response to a magnetic field in the absence of electron excitation.

The principles of magnetometry in the prior art may be explained in conjunction with FIG. 1A, in which a solid-state crystal sensor is illustrated as a block 10. Sensor 10 is composed of a chiral atomic structure allowing electron spin response and subsequent spin alignment with an incident magnetic field, illustrated by an arrow B(t). As described by Taylor et al., the crystal may be carbon atoms in a crystal (diamond) structure, with nitrogen impurities. FIG. 1B illustrates a diamond crystal with carbon atoms, some of which are designated 3. The crystal lattice of FIG. 1B also illustrates a vacancy (V) designated 4, resulting from an offset nitrogen atom 5. In FIG. 1C, the direction of the external or incident magnetic field is illustrated by B(t) arrow 6, and this direction is normal to the "vacancy axis". The vacancy axis is displacement vector extending from the vacancy point to the displaced nitrogen atom. Also in FIG. 1C, curved arrow 7 shows the direction of precession of the nitrogen atom in response to magnetic field B(t). In the absence of excitation of the "vacancy electrons" (electrons of the carbon atoms surrounding the vacancy), their quantum energy levels are identical, as suggested by the equal lengths of energy-level-representative arrows 8.

Figure 1D:
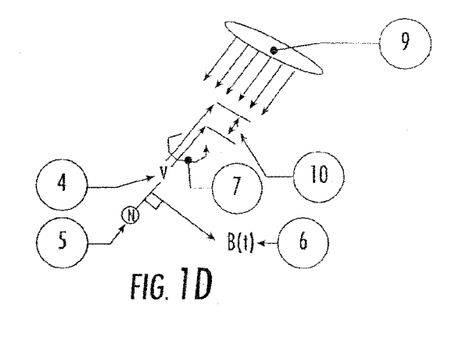
FIG. 1D illustrates the result of illuminating the crystal lattice of FIG. 1C with an excitation light pulse selected to excite electron spin precession about an incident magnetic field.
Figure 1E:
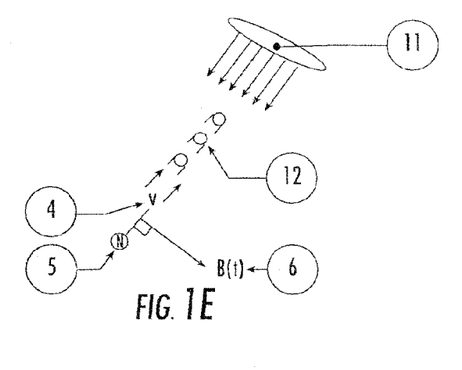
FIG. 1E illustrates the emission of red photons in response to the application of an out-of-phase light pulse.

FIG. 1D is similar to FIG. 1C, and shows the result of a first excitation pulse 9 of light at a wavelength of 532 nanometers (nm) and with a duration of T seconds. The wavelength of the light pulse is selected to excite electron spin precession about the incident magnetic field B(t), which also results in a corresponding phase change between electron quantum energy spin (+½ or −½) spin states. The phase differences in the spin states of the vacancy electrons resulting from this excitation are illustrated as a two-headed arrow 10. The phase difference of the vacancy's quantum electron energy levels is proportional to the spin precession. FIG. 1E illustrates application of a second pulse 11 of green light at the same 532 nm wavelength and with duration T seconds. The excitation of the electron states attributable to the second pulse is out-of-phase with the excitation attributable to the first pulse. That is, the timing T of the second pulse relative to the first pulse is selected so that the previously excited electron states 10 are driven to ground energy level or state. As a result of the transition to the ground state, the electrons emit red-light photons illustrated as 12, and the number of the red-light photons is proportional to the phase difference, which in turn is proportional to the magnitude of the incident magnetic field B(t).

Figure 1F:
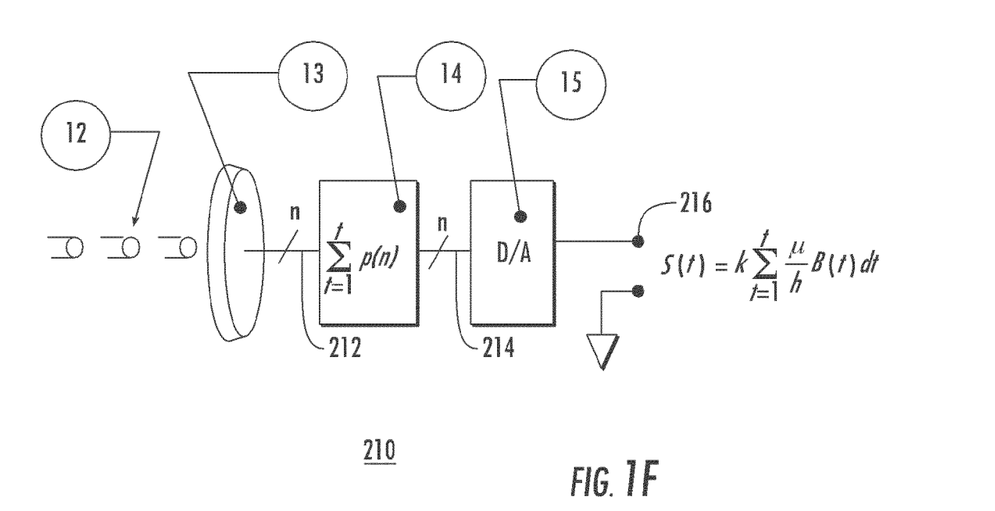
FIG. 1F is a simplified diagram according to an aspect of the invention illustrating a magnetic sensor which generates red photons and processing for converting emitted photons to an electrical signal representing the strength of a magnetic field component.

FIG. 1F illustrates the photons of red light 12 applied to a charge-coupled two-dimensional imaging array device illustrated as 13 within an apparatus 210 according to an aspect of the invention. Imaging device 13 includes n cells, and converts the incident red light into electrical signal in the form of charge. In theory, it would be possible to use a single photodetector element, but as the light radiation leaving the crystal sensor may not be confined to a single direction, the detection must take place over a finite area. The photon-representative electron charge is coupled over n parallel paths 212 to an accumulator or integrator illustrated as a block 14, which accumulates the charge for a period τ to produce integrated signal. The total integrated charge for each cycle of the accumulator is represented by a digital number, which is coupled over a path 214 to a digital-to-analog converter (DAC or D/A) 15. DAC 15 converts the digital number representing the number of red photons detected during the current interval τ into an analog or analogue signal S(t) proportional to the incident magnetic field component B(t). The analog signal appears at port 216, and may be written as $$S(t) = k \sum_{t=1}^{i} \frac{\mu}{h} B(t) dt$$

where:
  k is a calibration scale factor
  is the upper count value of summing index time, t
  μ is the Bohr Magneton, a natural physical constant
  h is Plancks constant, a natural physical constant The single-axis Taylor et al. magnetometer described in conjunction with FIGS. 1A, 1B, 1C, 1D, 1E, and 1F is highly sensitive to magnetic fields, at least in part because of the large number of sensing (vacancy) sites per unit volume in the solid diamond lattice. This number of sensing sites much exceeds that of gas-based sensors.

SUMMARY OF THE INVENTION

A magnetic anomaly detector according to an aspect of the invention comprises a magnetic field detector for generating analog signal in response to an incident magnetic field, and a sample-and-hold device coupled to the magnetic field detector for generating time-quantized analog signal from the analog signal. A discrete-time differentiator is coupled to the sample-and-hold device, for differentiating the time-quantized analog signal to thereby generate differentiated signal. A low-pass filter is coupled to the differentiator, for tending to reject spectral frequencies above a given value and to pass spectral frequencies below the given value, to thereby generate filtered signals. A Fourier transform device is coupled to the low-pass filter for receiving the filtered signals, and for transforming the filtered signals into a frequency-amplitude spectrum. A reference spectrum source is provided for generating at least one frequency spectrum representing the presence of a magnetic anomaly. An error detector is coupled to the Fourier transform device and to the reference spectrum source, for generating an error signal representative of the differences between the reference spectrum and the frequency-amplitude spectrum. An alarm is coupled to the error detector for responding to identification of one of a match and no match between the reference spectrum and the frequency-amplitude spectrum. In a particularly advantageous embodiment, the magnetic field detector for generating analog signal in response to an incident magnetic field comprises a photoresponsive solid-state crystalline device with lattice imperfections, in which lattice imperfections electrons resonate at a given wavelength. It also includes a source of timed sequential pairs of light pulses at the given wavelength, with the source being directed toward the device. As a result, (a) the first of the pulses raises the energy state of the electrons over a ground state, thereby creating first and second distinct quantum spin state populations, and (b) the second of the pulses of each pair of pulses occurs at a time such that the energy state of the electrons is reduced to the ground state, whereby (c) the reduction of the energy state generates photons which exit the device. The number of photons exiting the device is related to the magnitude of a magnetic field through the device. A photon detector responds to the photons and generates an electrical signal in response to the photons.

In one embodiment of the magnetic anomaly detector, the error detector includes a library reader for sequentially reading reference spectra from a memory, a current spectrum reader for reading a currently sensed spectrum, a subtractor and squaring arrangement for taking the difference between the reference and current spectra at each discrete frequency spectrum, and for squaring the difference values, and an overall fit comparison processor for selecting that one of the reference spectra which is the best match to the current spectrum, and for outputting an identification of the best-match anomaly to a display device.

According to another aspect of the invention, a magnetic anomaly detector comprises a photoresponsive solid-state crystalline device with lattice imperfections, in which lattice imperfections electrons resonate at a given wavelength. A source is provided of timed sequential pairs of light pulses at the given wavelength. The source is directed toward the device (possibly by way of a mirror), whereby (a) the first of the pulses raises the energy state of the electrons over a ground state, thereby creating first and second distinct quantum spin state populations, and (b) the second of the pulses of each pair of pulses occurs at a time such that the energy state of the electrons is reduced to the ground state, whereby (c) the reduction of the energy state generates photons, which may be of red light) which exit the device. The number of photons exiting the device is related to the magnitude of a magnetic field through the device. A photon detector responds to the photons and generates an electrical signal in response to the photons. A sample-and-hold device is coupled to the photon detector for generating time-quantized electrical signal, and a differentiator is coupled to the sample-and-hold device for differentiating the time-quantized electrical signal to produce differentiated signal. A low-pass filter is coupled to the differentiator for low-pass-filtering the differentiated signal to produce reduced-noise signal. An amplitude-time-to-amplitude-frequency spectrum converter is coupled to the low-pass filter, for converting the reduced-noise signal to an amplitude-frequency spectrum. A library of reference amplitude-frequency spectra is provided, each representing the amplitude-frequency spectrum of a magnetic anomaly. A comparator compares the amplitude-frequency spectrum with at least one reference amplitude-frequency spectrum to thereby determine the presence or absence of the magnetic anomaly. In a preferred embodiment of this detector, the photoresponsive solid-state crystalline device with lattice imperfections comprises a diamond crystal with offset nitrogen impurities. The photon detector may include a two-dimensional charge-coupled device for generating electrons in response to photons from the crystalline device, and an accumulator may accumulate the electrons from the charge-coupled device. A digital-to-analog converter may be coupled to the accumulator, for converting accumulated signal into analog signal. The differentiator may be a discrete-time differentiator.

DESCRIPTION OF THE INVENTION

Figure 2:
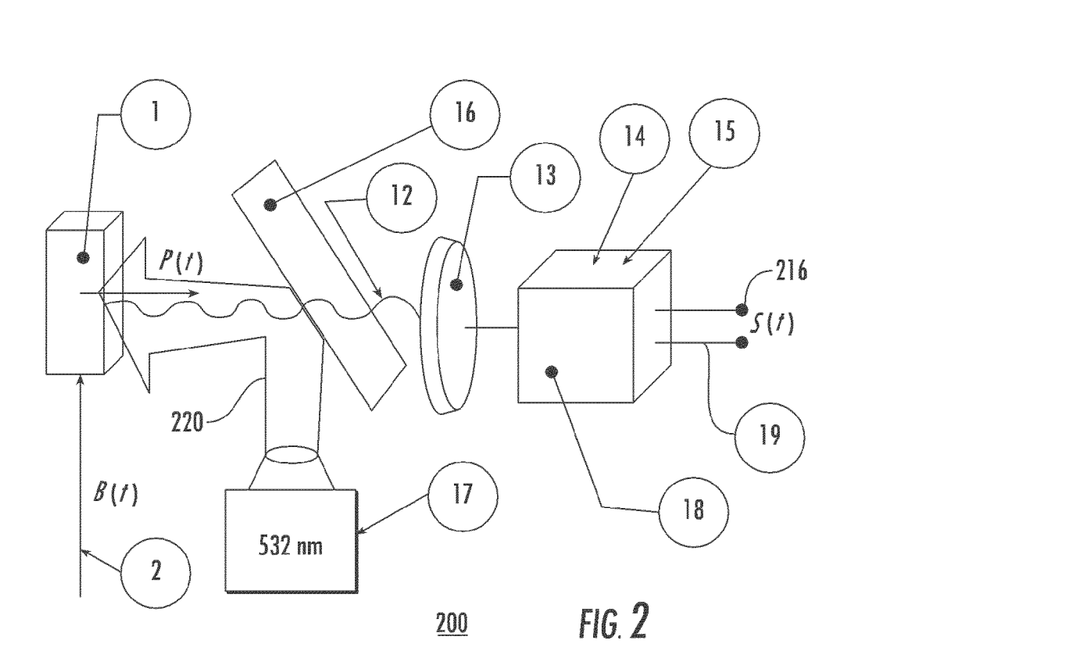
FIG. 2 is a simplified diagram illustrating a magnetometer apparatus for generating an electrical signal in response to the magnitude of a component of a magnetic field.

FIG. 2 illustrates generally the same magnetic detector structure 200 as that described in conjunction with FIGS. 1A, 1B, 1C, 1D, 1E, and 1F, and shows some additional details. Elements of sensor 200 of FIG. 2 corresponding to those of other FIGURES are designated by like alphanumerics. In FIG. 2, nitrogen-vacancy diamond crystal sensor 1 has an applied magnetic field component B(t) designated 2. A controlled light pulse source 17 at a wavelength of 532 nm. produces pairs of light pulses, illustrated as an arrow 220, which impinge on a semitransparent or wavelength-selective mirror 16. Mirror 16 reflects the 532 nm light toward the crystal sensor 1, to thereby excite the electron states. After the second pulse of each pulse pair, the sensor emits red light illustrated by a photon symbol 12, which leaves the sensor and passes through wavelength-selective mirror 16 and arrives at the photodetector 13. Photodetector 13 produces electrical signal proportional to the magnitude of the magnetic field 2, which is applied to a block illustrated as 18, which incorporates the functions of accumulator 14 and DAC 15, to thereby produce the analog signal S(t) at port 216.

Figure 3:
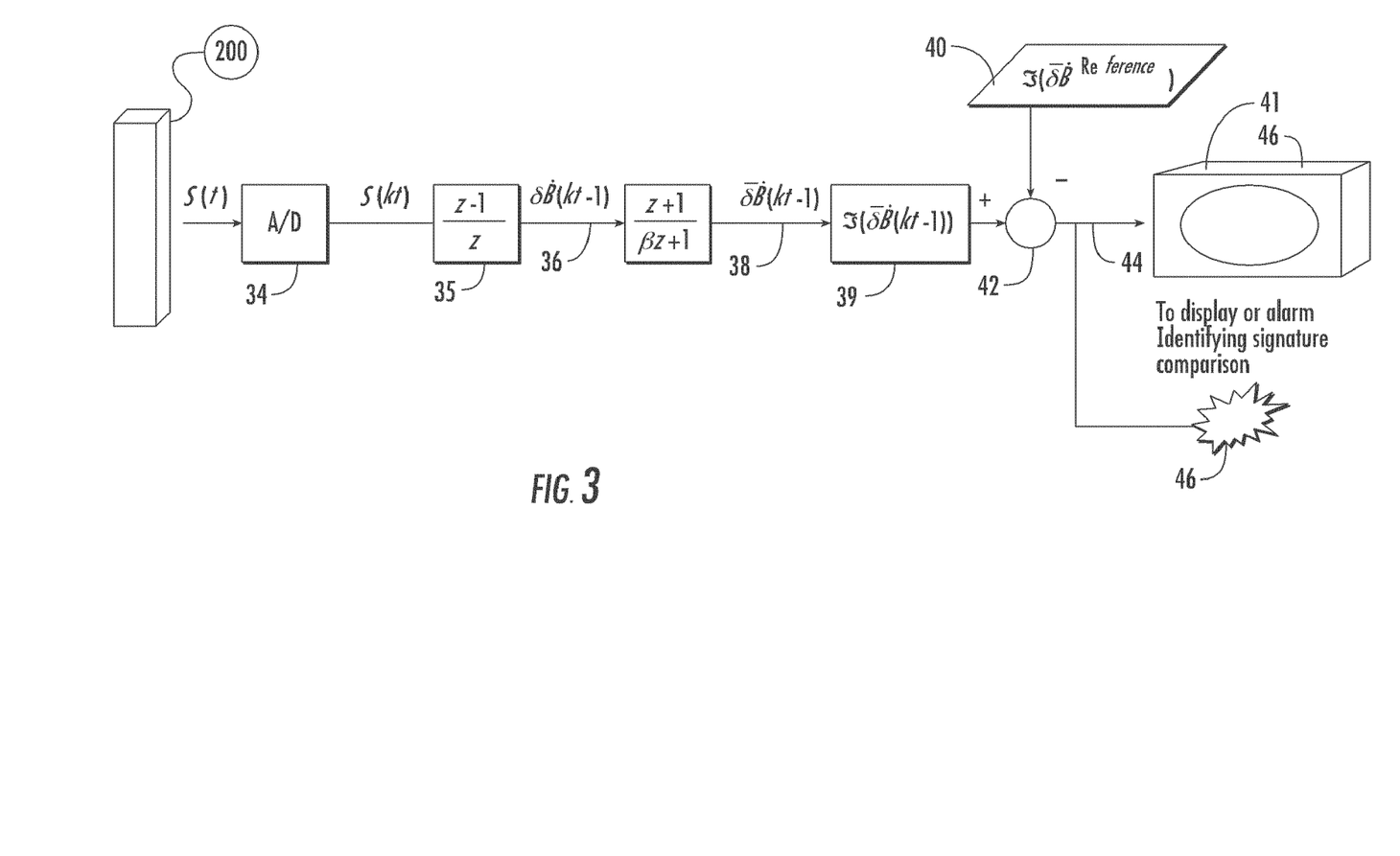
FIG. 3 is a simplified block diagram of a magnetic anomaly detector using the magnetometer of FIG. 2 to produce amplitude- or phase-frequency spectra representing the sensed magnetic signal, and comparing the spectra with reference spectra to identify the anomaly associated with the signal.

According to an aspect of the invention, a magnetic anomaly detector includes a single-axis sensor such as that described in conjunction with FIGS. 1A, 1B, 1C, 1D, 1E, 1F, and 2. In FIG. 3, the single-axis sensor of FIG. 1F is designated 200, and its output S(t) is applied to a sample-and-hold sampling device 34, which produces a time sequence of analog signals designated S(kt). The sampled analog signals are applied from sampler 34 to a differentiator illustrated as a block 35. Differentiator 35 performs a simple (z−1)/z quotient and produces a discrete-time rate-of-change scalar signal. The differentiated magnetic field of the Earth as it appears at the output of the discrete differentiator 35 is identified as 36 and given by $$\partial \dot{B}(kt-1)$$

Due to the extreme sensitivity of the magnetometer, high-frequency noise may be present. The output of discrete differentiator 35 is applied to a low-pass filter 37

$$\frac{z+1}{Bz+1}$$

to reduce high-frequency noise contamination of the differentiated measured Earth magnetic field vector at time kt−1. The resulting low-passed signal on path 38 may be written as $$\delta \dot{B}(kt-1)$$

The low-pass filtered signal on path 38 is applied to a Fourier transform illustrated as fast discrete Fourier transformer block 39

$$\Im(\delta \dot{B}(kt-1))$$

Fourier transform block 39 convert the discrete-time signal sequence to the instantaneous frequency domain. The resulting frequency spectrum is applied to the noninverting (+) input port of an error detector (subtractor) 42. A reference spectrum $\Im(\delta \dot{B}^{reference})$ is applied from a "library" source 40 to the inverting (−) input port of error detector 42. Library source 40 stores a set of many precomputed spectra representing the characteristics of many possible magnetic anomalies. Error detector 42 compares the spectra applied to its noninverting and inverting input ports, and produces a signal representing the similarity or dissimilarity of the reference signal and the signal under consideration. This signal is applied by way of a path 44 to a block 41, which represents a display indicative of the presence of a magnetic anomaly. Such a display, if used only to display anomaly information to a human operator, is subject to the possibility of inattention due to long periods without detection of an anomaly. Thus, where the presence of an anomaly may be of significance, as for example when patrolling for the presence of submarines, it may be advantageous to apply the error signal to an alarm 46 so as to alert the operators to the presence of the anomaly.

The reference spectra for the library may be generated empirically or mathematically. The empirical method may be as simple, for the case of submarine detection or identification, as moving a magnetometer at various angles across various portions of a submerged test submarine, to produce magnetometer signal, and processing the magnetometer signal in the manner described in conjunction with blocks 34, 35, 37, and 39 of FIG. 3 to produce each reference spectrum. The spectrum will depend not only on the characteristics of the submarine, but on the path traversed across the submarine, such as across the bow, the main body, or the stern. In addition, the spectrum will depend, in part, on the relative speeds of the submarine and the vehicle carrying the magnetometer.

Figure 4:
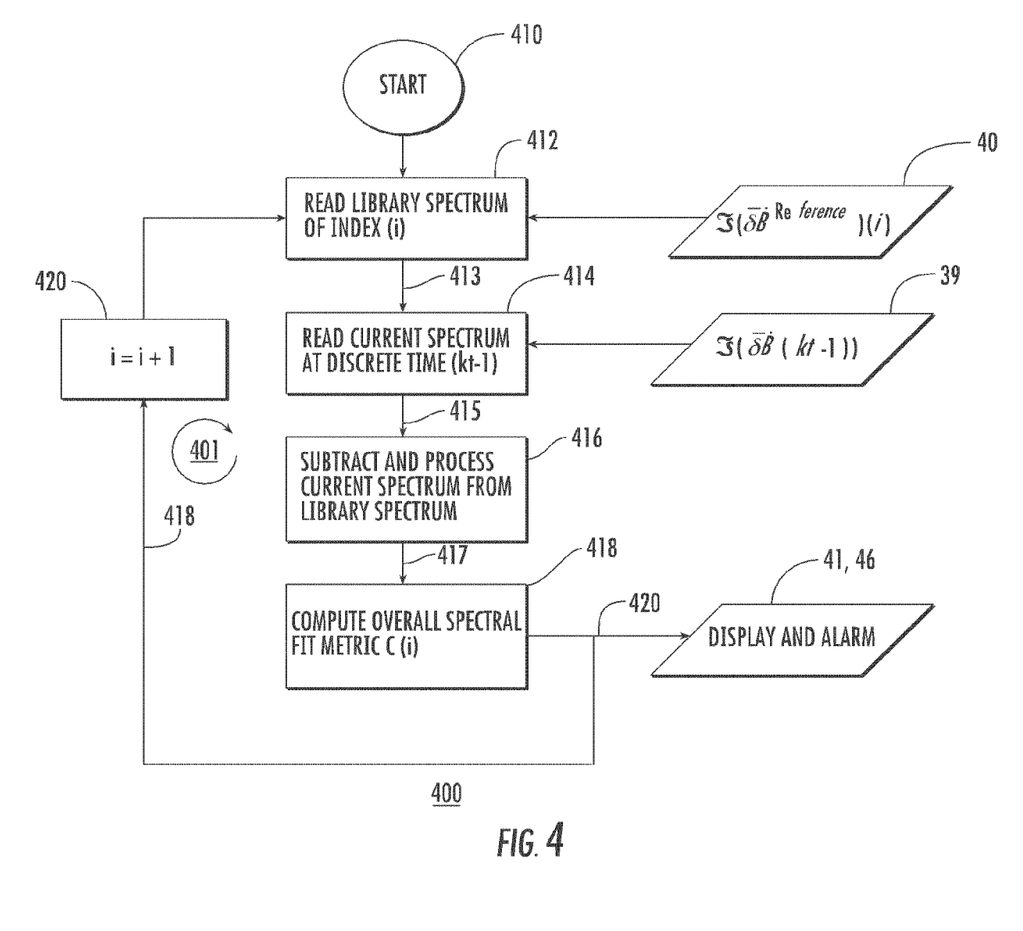
FIG. 4 is a simplified logic flow chart or diagram illustrating processing in the arrangement of FIG. 3 for performing comparisons of the spectrum of an anomaly with a library of spectra.

FIG. 4 represents the logic 400 performed in comparison block 42 of FIG. 3. In FIG. 4, the logic 400 for performing the comparison of the spectrum of the anomaly under consideration with the library of spectra starts at a START block 410 and flows to a block 412, which represents the reading of the first spectrum $\Im(\delta \dot{B}(i)^{REF}$ from the reference library 40 using the first index value i. From block 412, the logic 400 flows by a path 413 to a further block 414, which represents the reading from transform block 39 of FIG. 3 of the current spectrum $\Im(\delta \dot{B}(kt-1)$ at discrete time (kt−1) of the current anomaly under consideration. It should be understood that the "current anomaly" may be no anomaly whatever, so that the spectrum will be nominal. The logic 400 flows from block 414 by way of a path 415 to a block 416. Block 416 represents the taking of the difference between the current spectrum and the current library spectrum, as described in more detail in conjunction with FIG. 5. The values of the spectral differences are temporarily stored. The stored spectral difference(s) is or are applied from block 416 by way of a path 417 to a block 418, which computes an overall fit or comparison variable. From block 418, the logic flows by way of a path 419 and an i=i+1 index-incrementing block 420 back to block 412. Block 412 selects the next library spectrum or spectrum in response to the incremented index for comparison with the currently sensed spectrum. The logic 400 iterates around the loop 401 including blocks 412, 414, 416, 418, and 420, separately accumulating in block 418 the differences between the spectrum under consideration and the reference spectra. When all the reference spectra have been evaluated with the currently sensed spectrum and all the differences have been stored, logic block 418 sorts the stored values, and selects the closest match as representing the currently sensed spectrum. The reference spectrum which most closely matches the currently sensed spectrum is deemed to identify the anomaly. From block 418, the logic flows to the display/alarm block 41, 46. The now-identified anomaly is sent to the alarm 46 or display 41 to complete the operation for the current set of sensed magnetic signals.

Figure 5:
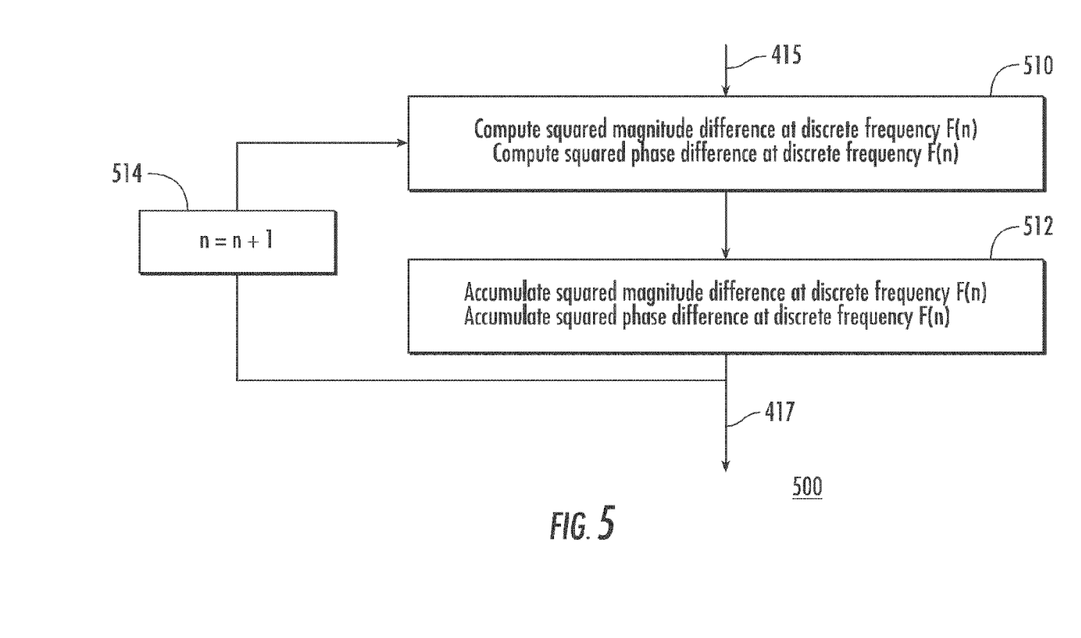
FIG. 5 is a simplified logic flow chart or diagram illustrating details of the processing of FIG. 4.
Figure 6A:
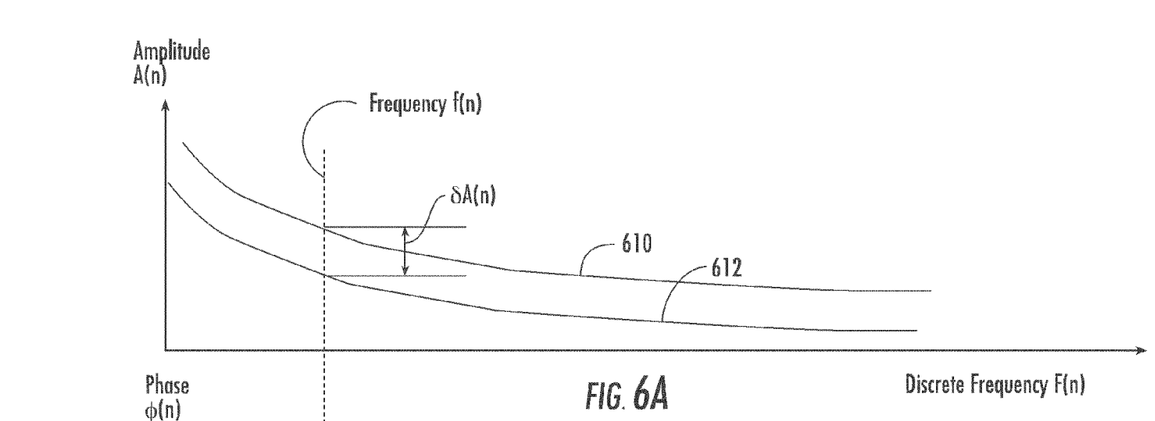
FIGS. 6A and 6B represent amplitude- and phase-frequency spectra, respectively, useful in understanding the processing of FIGS. 4 and 5.
Figure 6B:
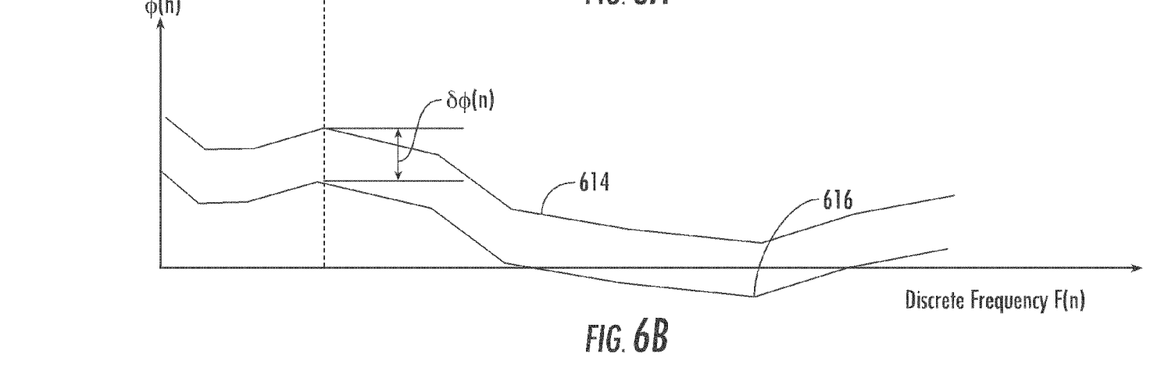

FIG. 5 is a simplified logic flow chart or diagram illustrating details of the operation of block 416 of FIG. 4. In FIG. 5, logic 500 begins with the arrival from path 415 of both the current and the reference library spectra. FIG. 6A a represents the amplitude-versus-frequency spectrum of the currently sensed signal and of the reference spectrum plotted together at aligned frequencies. The amplitude axis is designated A(n). The current amplitude plot is designated 610 and the reference amplitude plot is designated 612. At any discrete frequency f(n) the difference between the currently sensed and the reference values can be evaluated, and is represented in FIG. 6A by the difference δA(n). Thus, the result of taking the difference in FIG. 6A is a set of amplitude differences with their corresponding frequencies. FIG. 6B illustrates the phase-versus-frequency characteristics of the sensed signal spectrum and of the reference spectrum. The phase axis is designated Φ(n). At any discrete frequency, the difference between the phases can be determined or evaluated, to produce a set of phase differences at each discrete frequency. A representative difference is designated δΦ(n). The result of taking the differences in FIG. 6B is a set of phase differences with their corresponding frequencies. Block 510 of FIG. 5 computes the differences between the reference and currently sensed spectra for at least one of amplitude and phase, and preferably for both. From block 510, the logic 500 of FIG. 5 flows to a block 512, which represents the "summing" or accumulating of the squares of the amplitude difference values across all the frequencies of the relevant spectrum. The squares of the phase difference values are also accumulated separately from the magnitudes. Thus, block 512 represents the calculation of an overall fit metric C, which may be, for example, the square-root of the sum of the squared magnitudes and squared phase differences $$C(i) = \sqrt{A(i) + \phi(i)}$$

In operation of the logic of FIG. 5, the index n increments at each iteration to thereby step across the discrete frequencies f(n) illustrated in FIGS. 6A and 6B. As the logic steps through its functions, the amplitude differences for each frequency n can be represented by $$A(i) = \sum_{j=1}^{n} (\delta A(j))^2$$

and the phase differences can be represented by $$\Phi(i) = \sum_{j=1}^{n} (\delta \Phi(j))^2$$

The resulting amplitude and phase differences are outputted from the logic of FIG. 5 by way of path 417, to return to block 418 of the logic of FIG. 4. Those skilled in the art will understand that the comparison of the spectra may be of magnitude or of phase, or of both magnitude and phase. In operation of the logic 400 of FIG. 4, the loop iterates and makes the comparisons of the current spectrum with the library spectra until such time as all the reference spectra have been compared with the current input, at which time a decision is made of which of the reference spectra is the closest match. The corresponding reference spectrum is identified and used for alarm or display.

A magnetic anomaly detector according to an aspect of the invention comprises a magnetic field detector (200) for generating analog signal (S(t)) in response to an incident magnetic field (B(t)), and a sample-and-hold device (34) coupled to the magnetic field detector (200) for generating time-quantized analog signal (S(kt)) from the analog signal (S(t)). A discrete-time differentiator (35) is coupled to the sample-and-hold device (34), for differentiating the time-quantized analog signal (S(kt)) to thereby generate differentiated signal (∂B̃(kt−1)). A low-pass filter (37) is coupled to the differentiator (35), for tending to reject spectral frequencies above a given value and for tending to pass spectral frequencies below the given value, to thereby generate filtered signals δB̃(kt−1). A Fourier transform device (39) is coupled to the low-pass filter (37) for receiving the filtered signals, and for transforming the filtered signals into a frequency-amplitude spectrum. A reference spectrum source (40) is provided for generating at least one frequency spectrum $\Im(\delta \tilde{B}^{reference})$ representing the presence of a magnetic anomaly. An error detector or comparator 42) is coupled to the Fourier transform device (39) and to the reference spectrum source (40), for generating an error signal representative of the differences $$\left( A(i) = \sum_{j=1}^{n} (\delta A(j))^2 \text{ and or } \Phi(i) = \sum_{j=1}^{n} (\delta \Phi(j))^2 \right)$$

between the reference spectrum and the frequency-amplitude spectrum. An alarm (46) is coupled to the error detector (42) for responding to identification of one of a match and no match between the reference spectrum and the frequency-amplitude spectrum. In a particularly advantageous embodiment, the magnetic field detector (200) for generating analog signal in response to an incident magnetic field (B(t)) comprises a photoresponsive solid-state crystalline device (1) with lattice imperfections, in which lattice imperfections electrons resonate at a given wavelength (532 nm). It also includes a source (17) of timed sequential pairs of light pulses at the given wavelength (532 nm), with the source being directed toward the device (possibly by way of a half-silvered or dichromic mirror 16). As a result, (a) the first of the pulses raises the energy state of the electrons of the device (1) over a ground state, thereby creating first and second distinct quantum spin state populations, and (b) the second of the pulses of each pair of pulses occurs at a time such that the energy state of the electrons is reduced to the ground state, whereby (c) the reduction of the energy state generates photons (12) which exit the device (1). The number of photons (12) exiting the device (1) is related to the magnitude of a magnetic field B(t) through the device. A photon detector (13) responds to the photons and generates an electrical signal (S(t)) in response to the photons (12). In one embodiment of the magnetic anomaly detector, the error detector (42) includes a library reader (412) for sequentially reading reference spectra from a memory (40), a current spectrum reader (414) for reading a currently sensed spectrum, a subtractor and squaring arrangement (416) for taking the difference between the reference and current spectra at each discrete frequency spectrum, and for squaring the difference values, and an overall fit comparison processor (418) for selecting that one of the reference spectra which is the best match to the current spectrum, and for outputting (420) an identification of the best-match anomaly to a display device (41, 46).

According to another aspect of the invention, a magnetic anomaly detector (300) comprises a photoresponsive solid-state crystalline device (1) with lattice imperfections (N), in which lattice imperfection electrons resonate at a given wavelength (532 nm). A source (17) is provided of timed sequential pairs of light pulses (9, 11) at the given wavelength. The source (17) is directed toward the device (1), possibly by way of a mirror (16), whereby (a) the first of the pulses (9) raises the energy state of the electrons over a ground state, thereby creating first and second distinct quantum spin state populations, and (b) the second of the pulses (11) of each pair of pulses occurs at a time such that the energy state of the electrons is reduced to the ground state, whereby (c) the reduction of the energy state generates photons (red light 12) which exit the device (1). The number of photons exiting the device (1) is related to the magnitude of a magnetic field B(t) through the device (1). A photon detector (13) responds to the photons (12) and generates an electrical signal (S(t)) in response to the photons (12). A sample-and-hold device (34) is coupled to the photon detector (13) for generating time-quantized electrical signal (S(kt)), and a differentiator (35) is coupled to the sample-and-hold device (34) for differentiating the time-quantized electrical signal to produce differentiated signal $\Im(\delta B(kt-1))$. A low-pass filter (37) is coupled to the differentiator (35) for low-pass-filtering the differentiated signal to produce reduced-noise signal $\overline{\delta B}(kt-1)$. An amplitude-time-to-amplitude-frequency spectrum converter (39) is coupled to the low-pass filter (37), for converting the reduced-noise signal to an amplitude-frequency spectrum. A library (40) of reference amplitude-frequency spectra is provided, each representing the amplitude-frequency spectrum of a magnetic anomaly. A comparator compares the amplitude-frequency spectrum with at least one reference amplitude-frequency spectrum to thereby determine the presence or absence of the magnetic anomaly. In a preferred embodiment of this detector, the photoresponsive solid-state crystalline device (1) with lattice imperfections comprises a diamond crystal with offset nitrogen impurities. The photon detector may include a two-dimensional charge-coupled device (13) for generating electrons in response to photons from the crystalline device (1), and an accumulator (14) may accumulate the electrons from the charge-coupled device. A digital-to-analog converter (15) may be coupled to the accumulator (14), for converting accumulated signal into analog signal. The differentiator (35) may be a discrete-time differentiator (35).

What is claimed is:

1. A magnetic anomaly detector, comprising:
   a magnetic field detector for generating analog signals in response to an incident magnetic field;
   a sample-and-hold device coupled to said magnetic field detector for generating time-quantized analog signals from said analog signals;
   a discrete-time differentiator coupled to said sample-and-hold device, for differentiating said time-quantized analog signals to thereby generate differentiated signals;
   a low-pass filter coupled to said differentiator, for rejecting spectral frequencies above a given value and for passing spectral frequencies below said given value, to thereby generate filtered signals;
   a Fourier transform device coupled to said low-pass filter for receiving said filtered signals, and for transforming said filtered signals into a frequency-amplitude spectrum;
   a reference spectrum source for generating at least one frequency spectrum representing the presence of a magnetic anomaly;
   an error detector coupled to said Fourier transform device and to said reference spectrum source, for generating an error signal representative of differences between said reference spectrum and the frequency-amplitude spectrum; and
   an alarm coupled to said error detector for responding to identification of one of a match and no match between said reference spectrum and the frequency-amplitude spectrum.

2. A magnetic anomaly detector according to claim 1, wherein said error detector includes:
   a library reader for sequentially reading reference spectra from a memory,
   a current spectrum reader for reading a currently sensed spectrum,
   a subtractor and squaring arrangement for taking a difference between the reference and current spectra at each discrete frequency spectrum, and for squaring the difference values, and
   an overall fit comparison processor for selecting that one of the reference spectra which is the best match to the currently sensed spectrum, and for outputting an identification of the best-match anomaly to a display device.

3. A detector according to claim 1, wherein said magnetic field detector for generating analog signals in response to an incident magnetic field comprises:
   a photoresponsive solid-state crystalline device with lattice imperfections, in which lattice imperfections electrons resonate at a given wavelength;
   a source of timed sequential pairs of light pulses at said given wavelength, said source being directed toward said device, wherein the first of said pulses raises an energy state of said electrons over a ground state, thereby creating first and second distinct quantum spin state populations, and said second of said pulses of each pair of pulses occurs at a time such that the energy state of said electrons is reduced to said ground state, and wherein the reduction of said energy state generates generating photons which exit said device, the number of said photons exiting said device being related to a magnitude of a magnetic field through said device; and
   a photon detector for responding to said photons and for generating an electrical signal in response to said photons.

4. A magnetic anomaly detector, comprising:
   a photoresponsive solid-state crystalline device with lattice imperfections, in which lattice imperfections electrons resonate at a given wavelength;
   a source of timed sequential pairs of light pulses at said given wavelength, said source being directed toward said device, wherein the first of said pulses raises the energy state of said electrons over a ground state, thereby creating first and second distinct quantum spin state populations, and said second of said pulses of each pair of pulses occurs at a time such that the energy state of said electrons is reduced to said ground state, and wherein the reduction of said energy state generates photons which exit said device, the number of said photons exiting said device being related to a magnitude of a magnetic field through said device;
   a photon detector for responding to said photons and for generating an electrical signal in response to said photons;
   a sample-and-hold device coupled to said photon detector for generating time-quantized electrical signals;
   a differentiator coupled to said sample-and-hold device for differentiating said time-quantized electrical signals to produce differentiated signals;
   a low-pass filter coupled to said differentiator for low-pass-filtering said differentiated signals to produce reduced-noise signals;

an amplitude-time-to-spectrum converter coupled to said low-pass filter, for converting said reduced-noise signals to an amplitude-frequency spectrum;

a library of reference amplitude-frequency spectra, each representing an amplitude-frequency spectrum of a magnetic anomaly; and a comparator for comparing said amplitude-frequency spectrum with at least one reference amplitude-frequency spectrum to determine the presence or absence of said magnetic anomaly.

5. A detector according to claim 4, wherein said photoresponsive solid-state crystalline device with lattice imperfections comprises a diamond crystal with offset nitrogen impurities.

6. A detector according to claim 4, wherein said given wavelength is 532 nm.

7. A detector according to claim 4, wherein said photon detector includes:

a two-dimensional charge-coupled device for generating electrons in response to photons from said crystalline device;

an accumulator for accumulating said electrons from said charge-coupled device; and a digital-to-analog converter coupled to said accumulator, for converting accumulated signals into analog signals.

8. A detector according to claim 4, wherein said differentiator is a discrete-time differentiator.

9. A method for detecting a magnetic anomaly, comprising:
sensing a magnetic field using a single-axis sensor;
applying a signal output from the single-axis sensor to a sampling device to produce a time sequence of signals;
applying the sequence of signals to a differentiator to obtain discrete time rate of change scalar signals;
filtering the output from the differentiator to reduce high-frequency noise contamination of the time rate of change scalar signals;
transforming the low-pass filtered signals using a Fourier transform to convert the low-pass filtered signals to the instantaneous frequency domain;
applying the Fourier transformed signals a non-inverting input port of an error detector;
applying a plurality of reference signals to an inverting input port of the error detector;
wherein the plurality of reference signals represent a respective plurality of magnetic anomalies;
comparing the transformed signals with the plurality of reference signals to produce a plurality of signals, each of the plurality of signals representing a similarity of the associated reference signals to the transformed signals;
identifying that reference signals of said plurality of reference signals which most closely match the transformed signals; and
displaying the magnetic anomaly associated with the matching reference signals.

10. A method according to claim 9, wherein the single-axis sensor comprises a photoresponsive solid-state crystalline device with lattice imperfections, in which lattice imperfections electrons resonate at a given wavelength.

11. A method according to claim 10, wherein the photoresponsive solid-state crystalline device with lattice imperfections comprises a diamond crystal with offset nitrogen impurities.

12. A method according to claim 10, wherein said given wavelength is 532 nm.

13. A method according to claim 10, wherein the step of sensing a magnetic field further comprises producing pairs of light pulses through a semitransparent or wavelength-selective mirror which reflects light of a given wavelength toward the photoresponsive solid-state crystalline device to excite the electron states of the crystal;

wherein the second light pulse of each of said pairs of light pulses causes the crystal to emit red light that is detected by a photodetector; and wherein the photodetector produces electrical signals proportional to the magnitude of the magnetic field.

14. A method according to claim 9, wherein the step of comparing the transformed signals with the plurality of reference signals comprises comparing an amplitude vs. frequency spectrum of the transformed signals to an amplitude vs. frequency spectrum of each of the plurality of reference signals.

15. A method according to claim 14, wherein the step of comparing the transformed signals with the plurality of reference signals further comprises obtaining a set of phase differences between the transformed signals and each of the plurality of reference signals at each of a plurality of discrete frequencies.

16. A method according to claim 15, wherein the step of wherein the step of comparing the transformed signals with the plurality of reference signals further comprises obtaining an overall fit metric for each of the plurality of reference signals.

17. A method according to claim 9, wherein the step of filtering is performed using a low-pass filter.

18. A method according to claim 9, wherein the sampling device is a sample-and-hold sampling device.

19. A method according to claim 9, further comprising an alarm to alert an operator to the presence of the displayed magnetic anomaly.

20. A method according to claim 9, wherein the displayed magnetic anomaly represents the detection or identification of a submarine.

* * * * *